United States Patent [19]

Wong

[11] Patent Number: 5,430,604

[45] Date of Patent: Jul. 4, 1995

[54] HAND-HELD ELECTROSTATIC DISCHARGE GENERATOR

[76] Inventor: Sam Q. Wong, 3196 Switzer Gate, Mississauga, Ontario, Canada, L5N 3N2

[21] Appl. No.: 121,882

[22] Filed: Sep. 17, 1993

[51] Int. Cl.$^6$ .................... H01T 23/00; G01R 31/00; G01R 19/00; G01R 1/06
[52] U.S. Cl. ........................... 361/230; 324/72.5; 324/122; 324/149; 324/452; 324/228; 324/537
[58] Field of Search ............... 324/452, 455, 109, 72, 324/72.5, 122, 133, 149, 228, 500, 537, 555, 556; 361/230–235

[56] References Cited

U.S. PATENT DOCUMENTS

| | | |
|---|---|---|
| 2,942,189 | 6/1960 | Shea et al. |
| 3,265,969 | 8/1966 | Catu |
| 3,423,679 | 1/1969 | Smith |
| 3,425,049 | 1/1969 | Robinson |
| 3,863,149 | 1/1975 | Johnson .............. 324/133 X |
| 3,878,459 | 4/1975 | Hanna |
| 3,882,388 | 5/1975 | Nery |
| 4,007,418 | 2/1977 | Hanna |
| 4,054,805 | 10/1977 | Stebbins ............ 324/133 X |
| 4,066,953 | 1/1978 | Gold .................. 324/133 X |
| 4,433,296 | 2/1984 | Kolibas |
| 4,803,594 | 2/1989 | Zugravu |

FOREIGN PATENT DOCUMENTS

| | | |
|---|---|---|
| 3435839A1 | 4/1986 | Germany |
| 3903115C1 | 5/1990 | Germany |

OTHER PUBLICATIONS

Elektrostatische Entladung–Eine Gefahr Fur Moderne Elektronische Systems, D. Mohr, Erlangen, pp. 364, 366 and 367; 952 Elektrie 45(1991) No. 10, Berlin, DD.
The ESD Failure Detective, pp. 133, 134, 136 and 137; 8311 Test & Measurement World Incorp., Electronic Test; 11 (1991) Sep., No. 10, San Francisco, Calif. U.S.
Simulator Generates Severe ESD; Dan Romanchik, Technical Editor; 8311 Test & Measurement World 11 (1991) Dec., No. 13, San Francisco, Calif., U.S., pp. 37–38.
IBM Technical Disclosure Bulletin; vol. 19, No. 8, Jan. 1977 Electrostatic Discharge Tester, T. M. Madzy, L. A. Price and M. S. Ruduski, pp. 2967 and 2968.
International Electrotechnical Commission Technical Committee No. 65: Industrial–Process Measurement and Control: Draft–Revision of IEC Publication 801-2 Electromagnetic compatibility for industrial process measurement and control equipment—Part 2: Electrostatic discharge requirements. Aug. 1988.

*Primary Examiner*—Gerard R. Strecker
*Attorney, Agent, or Firm*—Dowell & Dowell

[57] ABSTRACT

An electrostatic discharge generator device for generating/simulating controlled electrostatic discharges, in both positive and negative polarities is disclosed for testing electronic equipment. The device includes an electrically conductive body with an attached contact probe mounted thereon and insulated therefrom. The device includes a high voltage generator and a mechanism to operate the generator. An impedance element is electrically connected to the generator. An electrical coupling interconnects the impedance element and the probe and has a spark gap formed therein. The spark gap is located in a sealed, vacuum or gas filled, chamber. The width of the spark gap determines in part the voltage level and signal characteristic of the ESD. Because of the conductive body, no ground wire is required from the equipment-under-test to the generator, as the human body of the user is used to complete the electric circuit loop. The spark gap is located near the contact probe providing a realistic simulation of a human direct air electrostatic discharge. The generator can be attached with alternative probes to generate electric fields and/or magnetic fields for testing the other components of electromagnetic interference generated by an electrostatic discharge.

17 Claims, 5 Drawing Sheets

HAND-HELD ELECTROSTATIC DISCHARGE GENERATOR

FIELD OF THE INVENTION

The present invention relates to electrostatic discharge generators for simulating human electrostatic discharges.

BACKGROUND OF THE INVENTION

This invention relates to electrostatic discharge (ESD) generators/simulators and particularly to devices which simulate positive and/or negative charged ESD that can occur when a human or an object, directly or indirectly, touches electronic equipment. This phenomenon is commonly known as static electricity.

ESD is generated when two objects with different electrical potential approach near each other such that an electric charge is transferred from one object to the other. Direct contact between the two objects is not required, as the static charge will jump or arc through the air (air gap) when the two objects are in close proximately. Inanimate objects may also generate ESD when moved in close proximately to each other, and this is commonly referred to as furniture ESD. Human ESD is generated when ESD jumps from a person to an object or other person. Naturally occurring ESDs have a very inconsistent electrical characteristic, dependent upon environmental conditions, object surfaces, and electrical potential differences.

In many instances, human ESD or furniture ESD can cause electronic equipment to malfunction. Equipment failures may also result from non-direct ESD, in that the equipment is not one of the two objects involved in the ESD generation. With direct ESD, the equipment will be subjected to voltage and current transients. All ESD will also generate non-direct electromagnetic interferences: an electric field (E-field) and a magnetic field (H-field). Individually or combined, all electromagnetic transients produced by direct and/or non-direct ESD can cause electronic equipment to malfunction. Therefore, it is important for manufacturers to be able to test the vulnerability of their electronic equipment to ESD. Further, it is expected that in the fixture it will be required that electronic equipment be tested to ensure that it meets certain minimum standards. As discussed below the International Electrotechnical Commission is developing standards for ESD testing. It is expected that eventually these standards will be adopted by member countries and equipment will be required to meet these standards.

There are several arrangements known in the prior art for simulating ESD. ESDs are not easily controlled because of their extremely fast rise time (in picoseconds) and their short pulse life (in nanoseconds) which are a result of air gap arcing between the two objects. Known ESD simulators are typically expensive, large and require a capacitor and an external alternating current or battery source.

The International Electrotechnical Commission (IEC) is developing a standard for ESD testing of digital electronic equipment. In 1988 a draft standards was produced entitled "Draft-Revision of IEC Publication 801-2 Electromagnetic compatibility for industrial process measurement and control equipment—Part 2: Electrostatic discharge requirements", (referred to as "IEC Standard 801-2"). This standard identifies two methods for testing human ESD: direct contact discharge and air discharge. In direct contact, the recommended simulator is charged to a predetermined voltage potential using an electrical capacitor (150 pF); a contact point is made to the equipment-under-test (EUT) and the electric discharge is generated by shorting the capacitor by means of relay contacts. The short causes the capacitor to discharge whereby the current is discharged through a resistor (330 Ohms) and then through the contact point into the EUT. A ground wire between the simulator and the EUT completes the circuit loop.

A direct contact discharge simulation is consistent but cannot give a reasonable approximation of a human discharge because it lacks the electrical arcing characteristics associated with human discharges. Under an air discharge test, the same simulator is used except the means of discharge is different. Specifically, the simulator is first charged then brought close to the EUT causing an electrical arc discharge to occur in the air gap between the EUT and the simulator. The discharge in this method is uncontrolled because the electrical characteristic of the arc is a function of the environmental conditions, the air gap distance, and the rate at which the simulator is moving toward the EUT.

Current simulators on the market cannot reproducibly control the characteristic of the ESD in the air discharge, hence a great number of tests must be performed to obtain a reasonable test result. Thus, most ESD testing uses the unrealistic non-arcing direct contact method. Further, simulators currently in use include a ground wire to complete the electrical circuit, however, the use of this ground wire introduces an impedance which can have adverse effects on the test.

It is an object of the present invention to provide a hand held trait with an internal source of energy, not requiring a ground wire, that generates an ESD with a readily controllable, reproducible electromagnetic discharge and which can be applied to the EUT directly. In effect, the present invention is designed to be easily used and to simulate more closely human ESD. In addition, the present invention may be adapted to use alternative probes to generate E-fields and H-fields, the other two components of the electromagnetic interference that an electrostatic discharge can produce.

SUMMARY OF THE INVENTION

The present invention provides an electrostatic discharge generator for generating/simulating controlled electrostatic discharges, in both positive and negative polarities, for testing electronic equipment. The generator has an electrically conductive body with an attached contact probe mounted thereon and electrically isolated therefrom. There is a high voltage generator and a mechanism to operate the generator. An impedance element is electrically connected to the generator. An electrical coupling interconnects the impedance element and the probe and has a spark gap formed therein. The spark gap is located in a sealed, vacuum or gas filled, chamber. The width of the spark gap determines in part the voltage level and signal characteristic of the ESD. Because of the conductive body, no ground wire is required from the equipment-under-test to the generator, as the human body of the user is used to complete the electric circuit loop. The spark gap is located near the contact probe providing a realistic simulation of a human direct air electrostatic discharge.

In another aspect of the invention the probe of the generator generates an electric field and/or a magnetic field for testing the other components of electromagnetic interference generated by an electrostatic discharge.

BRIEF DESCRIPTION OF THE DRAWINGS

The electrostatic discharge generator forming the present invention will now be described, by way of example only, reference being made to drawings in which.

DETAILED DESCRIPTION OF THE INVENTION

In the ensuing description of the structure and operation of the electrostatic discharge generator forming the present invention, reference will be made to the drawings in which like numerals refer to like parts.

Figure 1:
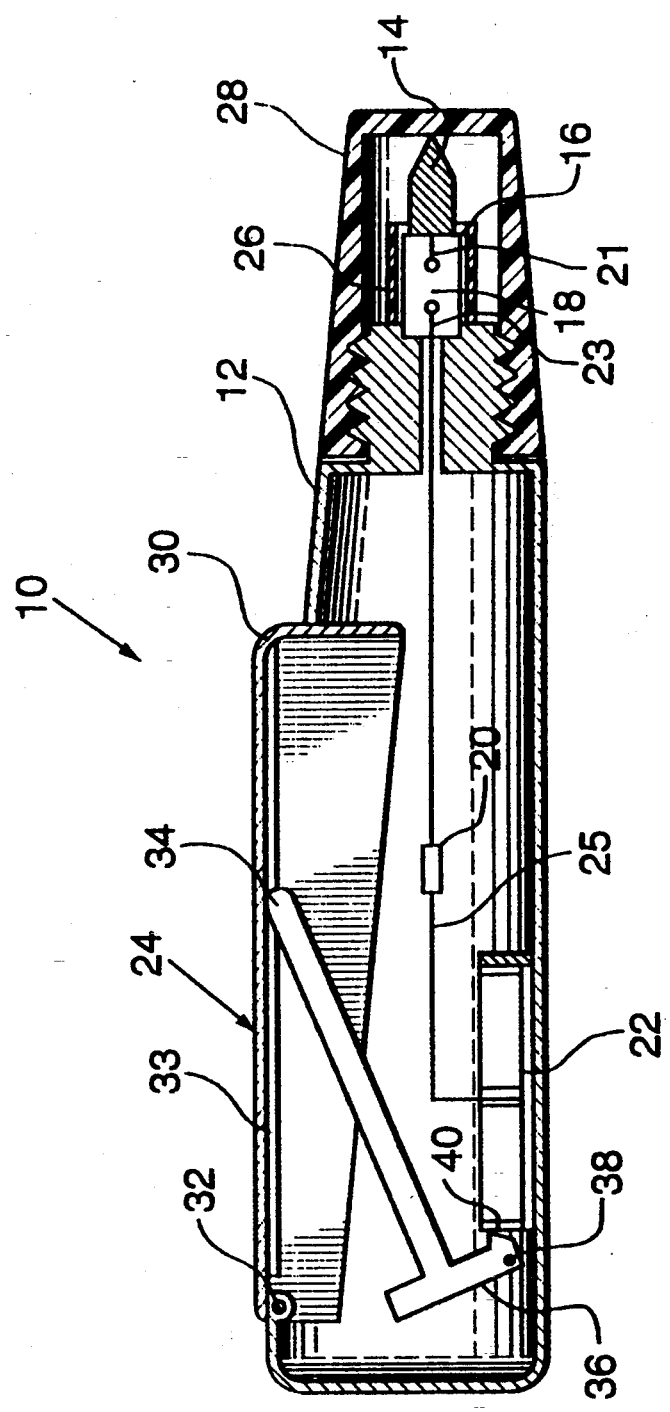
FIG. 1 is a side elevation view of an electrostatic discharge generator with a contact probe constructed in accordance with the present invention.
Figure 2:
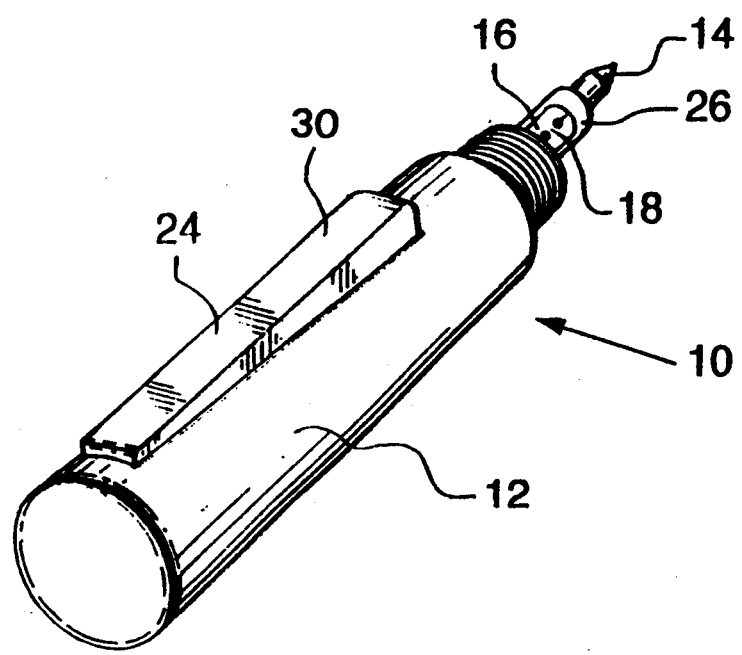
FIG. 2 is a perspective view of an electrostatic discharge generator constructed in accordance with the present invention with the protective end cap removed.

Referring first to FIG. 1 and FIG. 2, an electrostatic discharge generator, constructed in accordance with the present invention, is shown generally at 10 and includes an electrically conductive body or housing 12 which is shaped and dimensioned to be held in one hand by a user. Discharge generator 10 has a conductive contact probe 14 mounted thereon at one end thereof.

Located adjacent the contact probe 14 is a gap housing 26 enclosing a sealed chamber 16. Located within sealed chamber 16 is a spark gap 18. Chamber 16 can be either under vacuum or be gas filled.

Probe 14 is secured to gap housing 26 which in turn is secured to body 12. Gap housing 26 is fabricated of an electrically insulating material so that contact probe 14 is electrically isolated from housing 12 when the device is ready for use as shown in FIG. 2.

Spark gap 18 is a space between wire 21 and wire 23. Wire 21 is electrically connected to contact probe 14 and wire 23 is electrically connected to an impedance element 20 (such as a resistor) which in turn is electrically connected to a high voltage generator 22.

The preferred high voltage generator 22 is a piezoelectric crystal. Generator 22 is operably coupled to an actuating mechanism 24 and is activated by moving actuating mechanism 24 inwardly relative to body 12.

High voltage generator 22 is electrically connected to impedance element 20 by wire 25 and high voltage generator 22 is electrically connected to conductive body 12 by being in physical contact therewith. Unlike previously used devices, generator 10 automatically generates both a positive and a negative pulse discharge: on activation by applying pressure to the piezoelectric crystal one polarity charge is generated, on deactivation by relieving the pressure the opposite polarity charge is generated. With some known discharge simulators, a switch must be used to produce one or the other of these two polarities.

Actuating mechanism 24 is of known construction and it includes a lever 30 which has a pivot axis 32 and has a channel 33 down the middle of the underside for positioning rod 34. Rod 34 is fixedly attached to an end plate 36 which has a pivotal axis 38 and a protrusion 40. When lever 30 is moved inwardly relative to body 12, rod 34 pivots around pivot axis 32, thereby causing rod 34 to move forward in channel 33 and down into body 12 and end plate 36 to pivot around pivot axis 38, causing protrusion 40 to exert pressure on piezoelectric crystal (high voltage generator 22) thus activating the piezoelectric crystal and producing a voltage.

Body 12 is made of conductive material, such as metal, and forms an electrical conductor connected to the electrical circuit. The metallic contact probe 14 may be made of either steel or copper for example. Note that generator 10 does not require a ground connector, thereby providing a significant advantage over prior art devices. The electrical circuit path is completed through the user's body as will be discussed further below.

Gap housing 26 may be made of clear plastic, such that, chamber 16 and in particular spark gap 18 can be visually observed by the user. Upon activating generator 22, a visible electric spark may be observed arcing through spark gap 18. Alternatively, an optional visual indicator, preferably a neon indicator, may be included in the electrical circuit between impedance element 20 and spark gap 18. The visual indicator would be illuminated when activating mechanism 24 is pressed and contact probe 14 touches the equipment-under-test (EUT). Under these conditions the electrical circuit is closed and discharge is taking place.

An optional monitoring circuit may be attached to impedance element 20 to indicate the ESD current or voltage. Preferably this would be a digital indicator.

Figure 3:
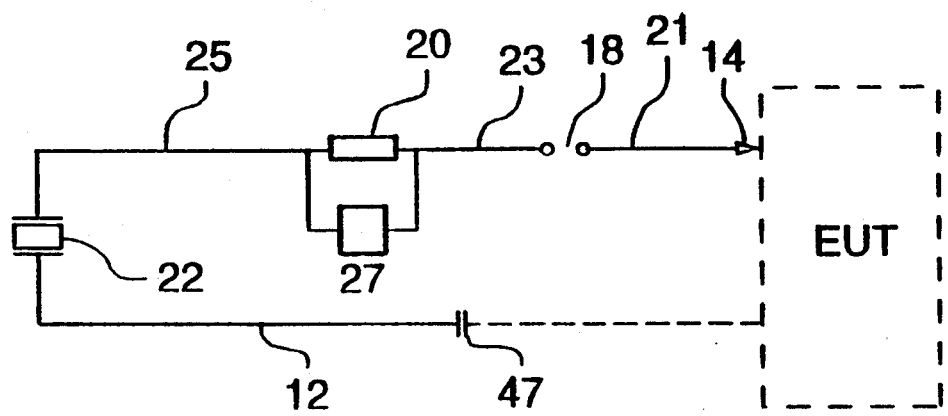
FIG. 3 is a schematic circuit diagram showing the effective circuit for an electrostatic discharge generator constructed in accordance with the present invention being applied to an equipment-under-test.

Element 27 in FIG. 3 shows the connection of the optional visual indicator or the optional monitoring circuit to the circuit.

Removably attached to body 12 is an electrically conductive protective cap 28 which is adapted to cover contact probe 14 when the device is not in use. Cap 28 when in place, contacts probe 14 and thereby electrically connected to body 12, so that the electrical circuit would be closed. Cap 28 prolongs the life of the piezoelectric crystal by closing the electric circuit when the crystal is activated accidentally when the generator is not in use. Cap 12 may be releasably attached to body 12 by any convenient method. FIG. 1 shows a threaded attachment.

In one preferred embodiment, the high voltage generator 22 is a *blitzy/b* model sonix P41 piezoelectric crystal. Impedance element 20 is a 400 ohm or lower value resistor, the spark gap 18 is in the range of 0.5 to 10 mm, and chamber 16 is vacuum sealed. Spark gap 18 may be adjusted and fixed between about 0.5 to 10 mm to produce the desired voltage discharge between 500 volts and 10,000 volts depending on the spark gap width. The voltage level is directly related to the width of the spark gap. Therefore, as the spark gap width increases, the breakdown voltage level increases. Spark gap 18 is sealed in chamber 16 to prevent environmental contamination and influence. Various gases may be used in chamber 16 to vary the arc characteristics and thus provide another means of changing the voltage discharge characteristics. Spark gap 18 is positioned as near probe 14 as practicable. Probe 14 typically is no longer than 1 inch.

Figure 8:
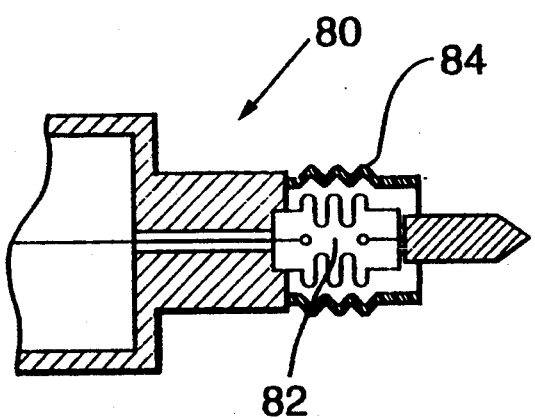
FIG. 8 is a broken away side view of an alternate embodiment of an electrostatic discharge generator having a variable spark gap.

Typically the width of the spark gap 18 will be set by the manufacturer. In an alternate embodiment discharge generator 80 has a variable spark gap. FIG. 8 shows a broken away side elevation of the end portion of the generator 80. The width of spark gap 82 is varied by varying the length of gap housing 84. Gap housing is manufactured from resilient material having the property that under pressure the material can be lengthened or shortened within limits, but under normal use the length of the material will not change length. Such material is well known. A number of alternate constructions could also be used to achieve the same results.

In operation, discharge generator 10, without cap 28 (as shown in FIG. 2), is placed in electrical contact with the EUT using contact probe 14. The user then activates actuating mechanism 24 by moving lever 30 relative to body 12 which applies pressure to the piezoelectric crystal so that high voltage generator 22 is activated producing an electrical charge current which is passed through impedance element 20, through spark gap 18, where an electric arc is produced, then through the EUT via contact probe 14. The electric circuit is closed across the body of the user which is connected to the electric loop by conductive body 12. FIG. 3 is a schematic diagram of the equivalent electric circuit. Capacitor 47 represents the capacitance between the user's body and the EUT.

Figure 4:
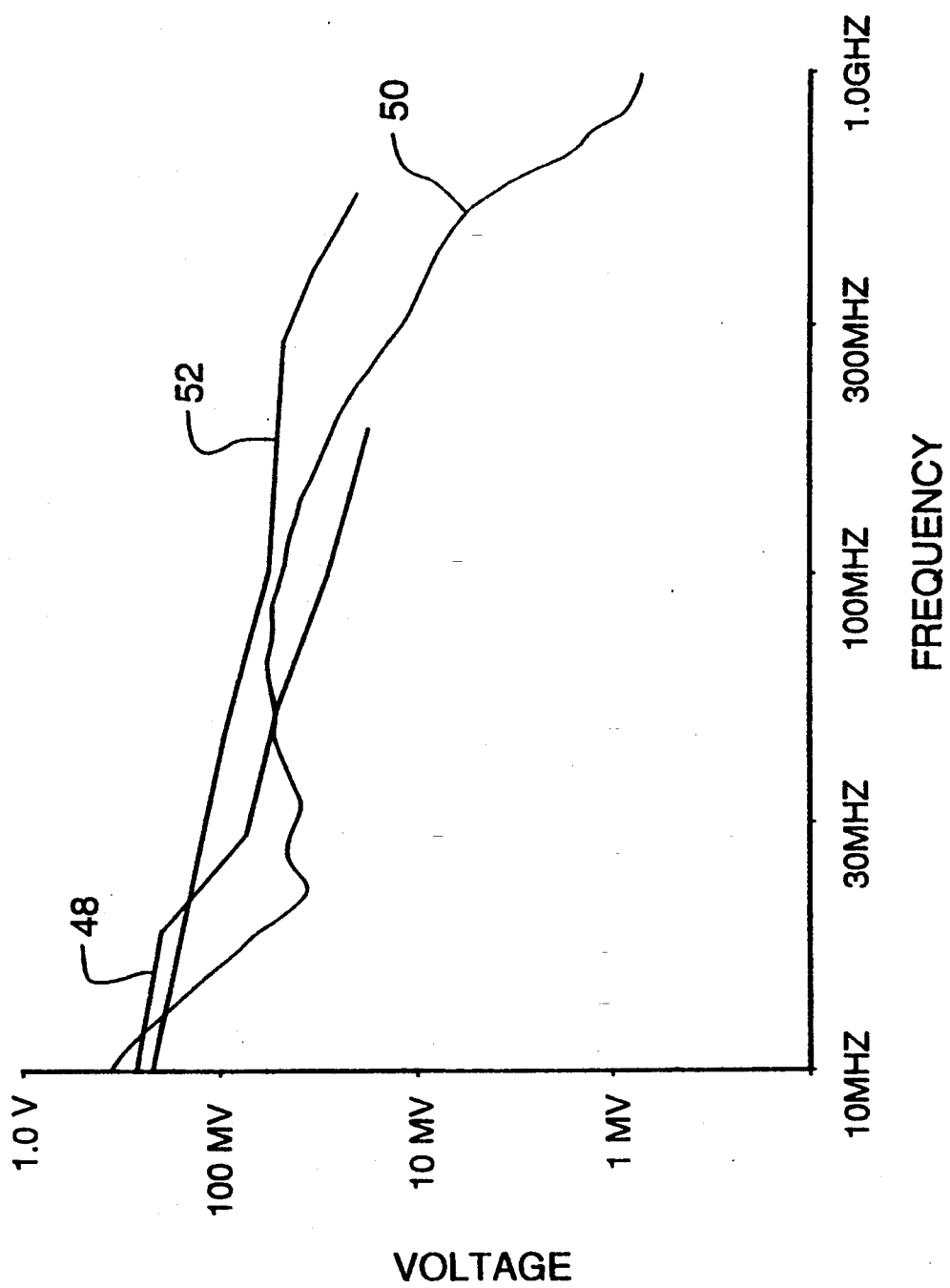
FIG. 4 is a graph representing the frequency and voltage characteristics of ESD generated by an electrostatic discharge generator constructed in accordance with the invention compared to ESD generated by a prior art simulator and by a human with a metal object.
Figure 5:
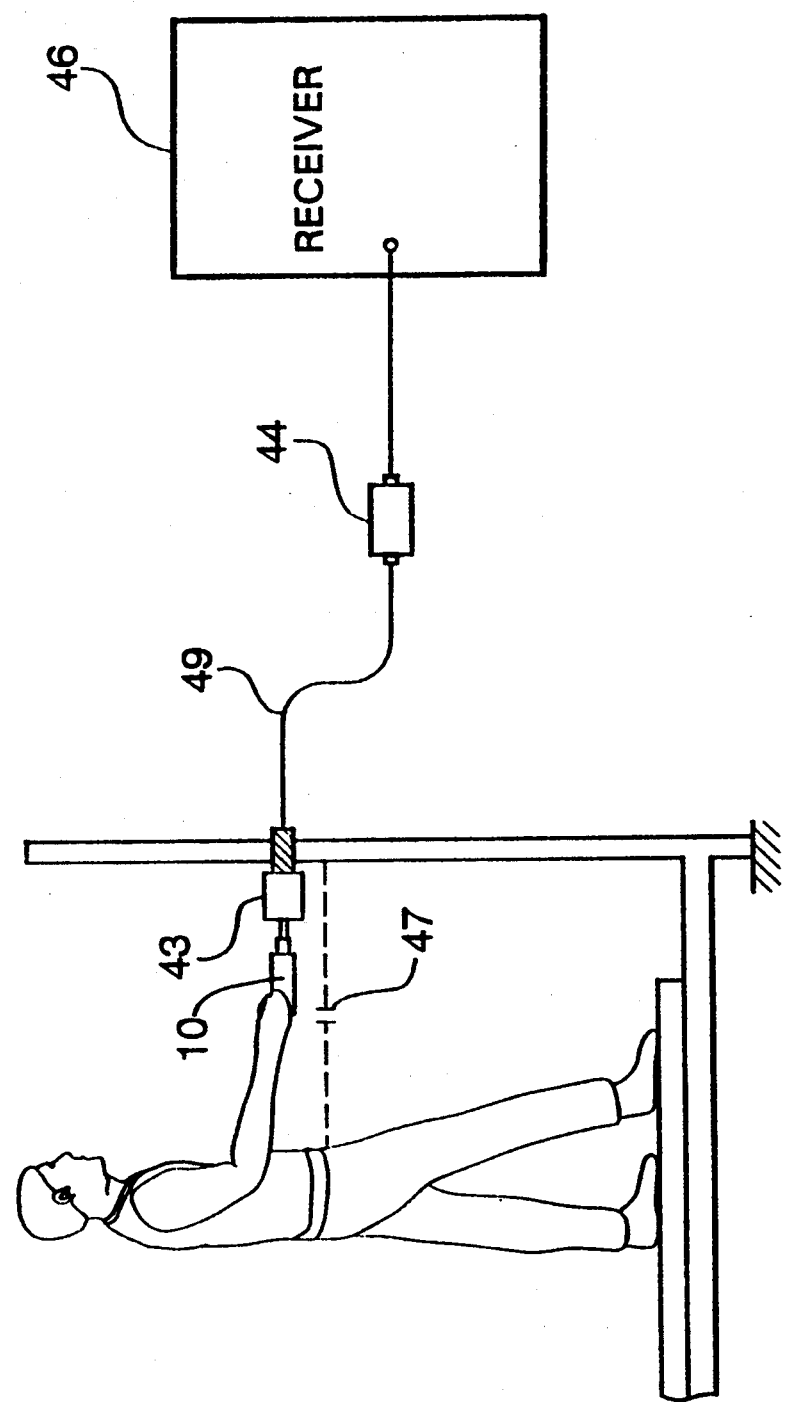
FIG. 5 is a schematic illustration of a system for calibrating an electrostatic discharge generator constructed in accordance with the present invention.

FIG. 5 shows a preferred method of testing electrostatic discharge simulator 10. A test target 43 is attached to a high pass filter 44 which is attached to a receiver 46. Filter 44 prevents an overload of receiver 46. Preferably target 43, high pass filter 44 and receiver 46 are interconnected by 50 ohm coaxial cables 49. The results from the test can be plotted on a graph of voltage versus frequency as shown in FIG. 4. The conventional test method is similar to the arrangement shown in FIG. 5 but conventionally the test target is connected to an oscilloscope and the ground wire of the discharge simulator is connected to the ground of the test chamber. More accurate test results can be obtained by using a receiver in the frequency domain.

FIG. 4 shows the electrostatic discharge from a human holding a metal object, where the discharge occurs through the metal object. The human is charged with an initial voltage of 4 kV as plotted in graph 48 and which was derived experimentally. Graph 50 shows the results of a 4 kV direct discharge from an electrostatic discharge simulator constructed according to the IEC Standard 801-2. Graph 50 is calculated from the results of IEC Standard 801-2 with the variable converted to voltage and frequency. Graph 52 shows the results from an electrostatic discharge generator 10 with a spark gap set at 2.5 mm and is derived experimentally. As can be seen from the graphs, the electrostatic discharge generator 10 more closely simulates the discharge from a human than does the prior art discharge simulator constructed in accordance with the IEC standards.

Figure 6:
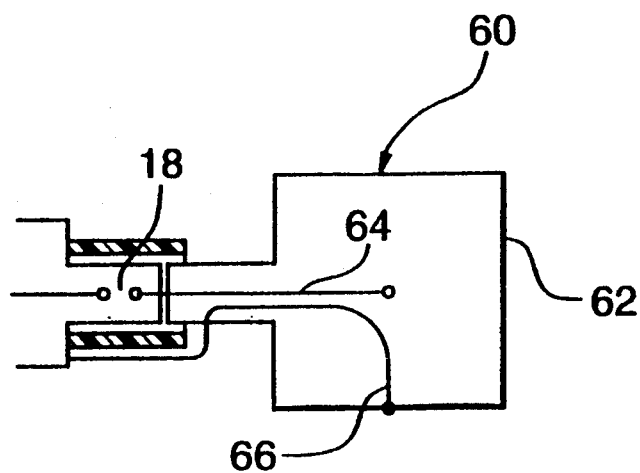
FIG. 6 is a top view, broken away, of an electrostatic discharge generator with an E-field probe constructed in accordance with the present invention.

In another embodiment of the invention, as seen in FIG. 6, E-field probe 60 may be attached to electrostatic discharge generator 10 in place of contact probe 14. E-field probe is comprised of metallic plate 62, an electrical wire 64 connected between the centre of plate 62 and terminating at one end of spark gap 18, and an electrical wire 66 connected between one side of plate 62 and conductive body 12. Electrical wire 66 completes the electric circuit. Generator 10 with E-field probe 60 can test electronic equipment for sensitivity to electric field noise. No energy is transferred, unlike a direct contact ESD which actually transfers energy into the EUT. Thus, using an E-field probe will not physically harm any electronic circuitry. In operation, generator 10 with E-field probe 66 would be held in close proximity to the electronic circuitry and then activated. By limiting the size of plate 62, the electric field generated can be localized, thereby the E-field probe can be used to localize sensitive problem areas within ESD susceptible electronic boards.

Figure 7:
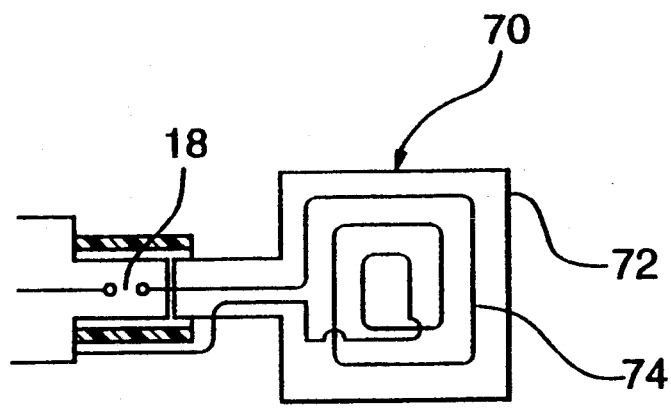
FIG. 7 is a top view, broken away, of an electrostatic discharge generator with an H-field probe constructed in accordance with the present invention.

In another embodiment of the invention, as seen in FIG. 7, H-field probe 70 can be attached to electrostatic discharge generator 10 in place of contact probe 14 or E-field probe 60. H-field probe 70 is comprised of board 72 and an electrical wire 74 with one end electrically connected to one end of spark gap 18, the other end is attached to conductive body 12, in between the wire is routed through a series of loops on board 72. Electrical wire 74 completes the electric circuit. The H-field probe 70 may be fabricated using printed circuit technology. Generator 10 with H-field probe 70 can test electronic equipment for sensitivity to magnetic field noise. No energy is transferred when using the H-field probe, thus, an H-field probe will also not physically harm any electronic circuitry. In operation, generator 10 with H-field probe 70 would be held close to the electronic circuitry and then activated. The number of loops of wire 74 determines the strength of the magnetic field generated. The H-field probe can be used to localize problem areas within ESD susceptible electronic boards.

Different probes may also be designed to generate a combination of the various electromagnetic interferences generated by an ESD. For example, an E-field and H-field probe (not shown) may be readily designed. The design of the conductive body 12 may be modified such that the said probes can be made removably attached.

It will be apparent to those skilled in this art that various modifications or changes can be made to the present electrostatic discharge simulators without departing from the spirit and scope of this invention. Accordingly, all such modifications and changes also within the scope of the appended claims and are intended to form part of this invention. For example, body 12 may be made of partially conductive material wherein there is enough conductivity such that the human body can complete the circuit.

We claim:

1. A hand-held electrostatic discharge generator to be held by an operator for simulating electrostatic discharge in order to test electronic equipment comprising:

an electrically conductive body;

a probe mounted on said conductive body, extending outwardly therefrom but electrically isolated therefrom for contacting the electronic equipment;

a voltage generator attached to said body and in electrical contact therewith;

an impedance element mounted in said body and electrically connected to said voltage generator;

an electrical coupling interconnecting the impedance element and the probe and having a spark gap formed therein and wherein the spark gap has a width that the generator produces a voltage discharge in the range from about 500 to about 10,000 volts; and operating means attached to said body to activate and deactivate said voltage generator whereby in use the operator holds the conductive body and places the probe against the electronic equipment to be tested, activates the voltage generator whereby a circuit is completed through the generator, the spark gap, the electronic equipment and the operator, and an electric arc is produced in the spark gap which is in an effective voltage range.

2. An electrostatic discharge generator according to claim 1 wherein said voltage generator is a piezoelectric crystal.

3. An electrostatic discharge generator according to claim 2 wherein said operating means is a pressure operated lever capable of applying pressure by means of compression or decompression to one side of said crystal.

4. An electrostatic discharge generator according to claim 3 wherein said probe is a metallic point.

5. An electrostatic discharge generator according to claim 4 wherein the width of said spark gap is in the range of 0.5 to 10 mm.

6. An electrostatic discharge generator according to claim 4 wherein the width of said spark gap is a variable spark gap in the range of 0.5 to 10 mm.

7. An electrostatic discharge generator according to claim 5 wherein said spark gap is located in a gas filled chamber.

8. An electrostatic discharge generator according to claim 5 wherein said spark gap is placed in a sealed vacuum chamber.

9. An electrostatic discharge generator according to claim 7 further including a removable cap which covers the metallic point probe.

10. An electrostatic discharge generator according to claim 1 including a visual indicator means electrically connected between said impedance element and said spark gap which illuminates when a discharge occurs across the spark gap.

11. An electrostatic discharge generator according to claim 1 further including a monitoring circuit attached to said impedance element to indicate the voltage or current.

12. An electrostatic discharge generator according to claim 1 wherein said probe is a metallic point.

13. An electrostatic discharge generator according to claim 1 wherein said probe is a metallic plate and having a center and a side, the center of the plate being electrically coupled to the impedance element and the side of the plate being electrically connected to the conductive body.

14. An electrostatic discharge generator according to claim 1 wherein said probe is a board comprising a series of looped electric wire having one end electrically coupled to the impedance element and the other end electrically connected to the conductive body.

15. An electrostatic discharge generator according to claim 1 wherein said spark gap is placed in a sealed vacuum chamber.

16. An electrostatic discharge generator according to claim 1 wherein the width of said spark gap is in the range of 0.5 to 10 mm.

17. An electrostatic discharge generator according to claim 1 wherein said spark gap is placed in a gas filled chamber.

* * * * *